(12) United States Patent
Scheiper et al.

(10) Patent No.: US 9,184,095 B2
(45) Date of Patent: Nov. 10, 2015

(54) CONTACT BARS WITH REDUCED FRINGING CAPACITANCE IN A SEMICONDUCTOR DEVICE

(75) Inventors: Thilo Scheiper, Dresden (DE); Sven Beyer, Dresden (DE); Uwe Griebenow, Markleeberg (DE); Jan Hoentschel, Dresden (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 675 days.

(21) Appl. No.: 12/917,763

(22) Filed: Nov. 2, 2010

(65) Prior Publication Data
US 2011/0210380 A1  Sep. 1, 2011

(30) Foreign Application Priority Data
Feb. 26, 2010  (DE) .......................... 10 2010 002 411

(51) Int. Cl.
| | |
|---|---|
| H01L 21/336 | (2006.01) |
| H01L 21/283 | (2006.01) |
| H01L 21/8234 | (2006.01) |
| H01L 21/768 | (2006.01) |
| H01L 23/485 | (2006.01) |

(52) U.S. Cl.
CPC .. *H01L 21/823425* (2013.01); *H01L 21/76897* (2013.01); *H01L 21/82345* (2013.01); *H01L 21/823462* (2013.01); *H01L 21/823475* (2013.01); *H01L 23/485* (2013.01); *H01L 2924/0002* (2013.01); *H01L 2924/3011* (2013.01)

(58) Field of Classification Search
CPC .................. H01L 29/66545; H01L 29/66575; H01L 29/49; H01L 21/76897; H01L 21/76883; H01L 21/82345
USPC ......... 438/230, 233, 592, 652, 672, 586, 595, 438/631; 257/E21.16, E21.44, E21.222, 257/E21.19
See application file for complete search history.

(56) References Cited

U.S. PATENT DOCUMENTS

| | | | | |
|---|---|---|---|---|
| 5,804,846 | A * | 9/1998 | Fuller ............................ | 257/252 |
| 5,960,270 | A * | 9/1999 | Misra et al. .................... | 438/197 |
| 6,445,050 | B1 * | 9/2002 | Chediak et al. ............... | 257/401 |
| 2001/0004542 | A1 * | 6/2001 | Woerlee et al. ............... | 438/291 |
| 2007/0138559 | A1 * | 6/2007 | Bohr .............................. | 257/351 |
| 2007/0262451 | A1 * | 11/2007 | Rachmady et al. ........... | 257/758 |
| 2010/0068877 | A1 * | 3/2010 | Yeh et al. ....................... | 438/592 |

OTHER PUBLICATIONS

Translation of Official Communication from German Patent Office for German Patent Application No. 10 2010 002 411.2 dated Sep. 30, 2010.

* cited by examiner

*Primary Examiner* — Marcos D Pizarro
(74) *Attorney, Agent, or Firm* — Amerson Law Firm, PLLC

(57) ABSTRACT

In sophisticated semiconductor devices, the contact structure may be formed on the basis of contact bars formed in a lower portion of an interlayer dielectric material, which may then be contacted by contact elements having reduced lateral dimensions so as to preserve a desired low overall fringing capacitance. The concept of contact bars of reduced height level may be efficiently combined with sophisticated replacement gate approaches.

20 Claims, 8 Drawing Sheets

CONTACT BARS WITH REDUCED FRINGING CAPACITANCE IN A SEMICONDUCTOR DEVICE

BACKGROUND OF THE INVENTION

1. Field of the Invention

The present disclosure generally relates to the fabrication of integrated circuits, and, more particularly, to the contact level of a semiconductor device, in which contact areas of drain and source regions are connected to the metallization system of the semiconductor device.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain and a source.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor elements but the electrical performance of the complex wiring fabric, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, in order to establish a connection of the circuit elements with the metallization layers, an appropriate vertical contact structure is provided, which connects to a respective contact region of a circuit element, such as a gate electrode and/or the drain and source regions of transistors, and to a respective metal line in the metallization layer. The contact structure may comprise contact elements or contact plugs having a generally square-like or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level may have to be provided with appropriate critical dimensions in the same order of magnitude. The contact elements may typically represent plugs which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material may be formed first and may be patterned so as to receive contact openings, which may extend through the interlayer dielectric material to the corresponding contact areas of the circuit elements. For this purpose, openings of very different depth may have to be formed in the interlayer dielectric material in order to connect to gate electrode structures or any other conductive lines formed above the semiconductor layer, while other contact openings have to extend down to a semiconductor layer, i.e., any contact areas formed therein. In particular, in densely packed device regions, the lateral size of the drain and source areas and thus the available area for the contact regions may be 100 nm and less, thereby requiring extremely complex lithography and etch techniques in order to form the contact openings with well-defined lateral dimensions and with a high degree of alignment accuracy, while the difference in etch depth may additionally contribute to the overall complexity of the patterning process.

After exposing the contact areas, which are frequently provided in the form of metal silicide regions, the contact metal, such as tungsten and the like, is deposited in the contact openings of different depth, thereby also contributing to a highly complex manufacturing process. For example, a plurality of contact openings are typically provided in the interlayer dielectric material so as to connect to the drain and source regions of transistors, wherein these contact openings may typically have a substantially round or square-like shape. Consequently, after providing the contact elements, the overall series resistance in the transistor, i.e., the resistance of the conductive path from one contact element through the source region, the channel region, the drain region and into the other contact element, may significantly depend on the resistivity for connecting to the contact areas, such as metal silicide regions provided in the drain and source areas. Upon further scaling of device dimensions, the contact resistivity for connecting to the drain and source areas of sophisticated transistor elements may represent a limiting factor of the overall transistor performance, thereby offsetting or at least reducing some of the advantages obtained by generally reducing the overall transistor dimensions. For example, in sophisticated manufacturing strategies, extremely complex mechanisms may be incorporated, such as strain-inducing semiconductor materials for enhancing charge carrier mobility in the channel region of the transistors, providing sophisticated gate electrode structures including high-k dielectric materials in combination with electrode metals and the like, which may per se result in superior transistor performance. For this purpose, superior contact regimes may also be required for efficiently connecting to the drain and source areas. In this context, it has been proposed to provide contact elements of increased lateral dimension along the transistor width direction to reduce the contact resistivity between the actual contact elements and the contact areas of the drain and source regions, such as the metal silicide regions. To this end, appropriate contact trenches may be formed in the interlayer dielectric material, which may subsequently be filled by an appropriate contact metal, thereby reducing the overall contact resistivity. On the other hand, providing contact trenches in the interlayer dielectric material so as to connect to the drain and source areas may significantly increase the fringing capacitance, which is to be understood as the parasitic capacitance between the gate electrode structures and the contact elements, thereby negatively affecting the overall AC performance of the transistor.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which contact resistivity of contact elements connecting to drain and/or source areas of transistors may be reduced by providing an increased lateral extension of these contact elements along a transistor width direction, without unduly increasing the overall parasitic fringing capacitance. To this end, contact bars may be formed in a first portion of an interlayer dielectric material and may connect to the drain and source contact areas, while, on the other hand, a height of the contact bars is restricted in order to not unduly increase the overall fringing capacitance. The contact bars may in turn be connected by "conventional" contact elements formed in another portion of the interlayer dielectric material so that, based on the conventional configuration of the contact elements, the parasitic capacitance between the gate electrode and the contact elements may not unduly increase. Thus, by providing a contact structure for connecting to the drain and source regions of semiconductor devices on the basis of a double contact regime including the low resistive contact bar and the contact element having the superior configuration with respect to parasitic capacitance, not only overall performance of the transistors may be enhanced, but also the complexity of patterning the interlayer dielectric material may be significantly reduced. In some illustrative aspects disclosed herein, providing the contact bars may be performed in the context of a so-called replacement gate approach, in which the interlayer dielectric material may be provided on the basis of two deposition processes with an intermediate replacement of at least a portion of a gate electrode structure. Consequently, any undue additional process complexity with respect to forming the contact bars with reduced height level may be avoided.

One illustrative method disclosed herein relates to forming a contact structure in a semiconductor device. The method comprises forming a contact bar in a first interlayer dielectric material, wherein the contact bar connects to at least one of a drain region and a source region of a transistor and has a first lateral extension along a transistor width direction. The method further comprises forming a second interlayer dielectric material above the transistor and the contact bar. Additionally, the method comprises forming a contact element in the second interlayer dielectric material so as to connect to the contact bar, wherein the contact element has a second lateral extension along the transistor width direction that is less than the first lateral extension.

One illustrative method disclosed herein comprises exposing a contact area of at least one of a drain region and a source region of a transistor of a semiconductor device by removing a portion of a first interlayer dielectric material. The method further comprises depositing a conductive material on the exposed contact area. Moreover, the method comprises removing an excess portion of the conductive material so as to form at least one contact bar. Additionally, the method comprises forming a second interlayer dielectric material above the first interlayer dielectric material and the contact bar.

One illustrative semiconductor device disclosed herein comprises a transistor comprising drain and source regions and a gate electrode structure. The semiconductor device further comprises a contact bar formed in an interlayer dielectric material and connecting to one of the drain region and source region, wherein the contact bar has a first lateral extension along a width direction of the transistor. The semiconductor device further comprises a contact element formed in the interlayer dielectric material so as to connect to the contact bar, wherein the contact element has a second lateral extension along the width direction that is less than the first lateral extension.

BRIEF DESCRIPTION OF THE DRAWINGS

The disclosure may be understood by reference to the following description taken in conjunction with the accompanying drawings, in which like reference numerals identify like elements, and in which.

Figure 1A:
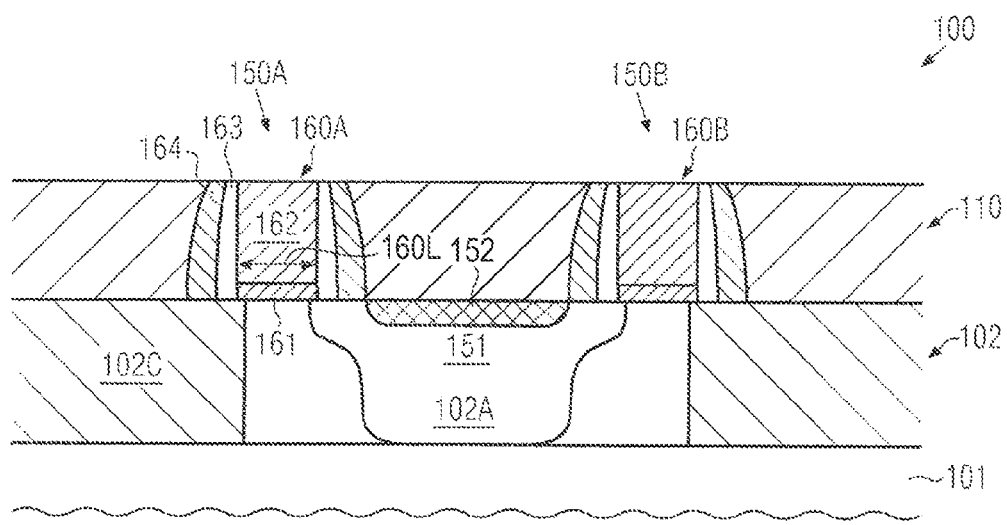
FIGS. 1a-1e schematically illustrate cross-sectional views of a semiconductor device in which a contact bar in combination with a contact element are formed so as to connect to a drain or source region between two closely-spaced gate electrode structures on the basis of a reduced overall contact resistivity, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides a contact structure for complex semiconductor devices, in which the advantages of low resistivity of contact elements extending along a significant portion of the width of an active region, or across the entire width, and the desired low parasitic capacitance of conventional contact elements are combined. To this end, the contact bars having a reduced contact resistivity may be provided in a first interlayer dielectric material so as to provide a height level that may not unduly reduce the overall AC performance of the transistor element. In some illustrative aspects disclosed herein, the contact areas of the circuit element under consideration, such as a transistor, may be exposed by any appropriate etch mask that may only require the definition along the width direction, while a substantially self-aligned behavior may be obtained along the length direction by using the selectivity of a gate electrode structure and a corresponding sidewall spacer structure. Consequently, the position and size of the contact bar may be accomplished on the basis of a non-critical lithography process, thereby avoiding undue complexity of the overall manufacturing process.

Upon forming the contact bar with the reduced height level, which may, for instance, substantially correspond to the height level of the gate electrode structures, a further interlayer dielectric material may be deposited and patterned so as obtain contact elements which have any appropriate shape so as to comply with device requirements in view of reducing overall parasitic capacitance between the gate electrode structures and the resulting contact structure. During the deposition and the patterning of the additional interlayer dielectric material, less demanding process conditions may also provide superior uniformity of the resulting contact elements. That is, the further interlayer dielectric material may be patterned on the basis of more uniform process conditions, since the etch process may require etching to substantially the same height level of any contact element, thereby significantly reducing etch-related irregularities. Similarly, the subsequent deposition of any appropriate contact metal may be accomplished with superior process results due to less demanding gap-fill capabilities of the corresponding deposition processes.

In some illustrative embodiments disclosed herein, the manufacturing sequence for providing the contact bars may be efficiently combined with sophisticated replacement gate approaches, thereby avoiding any additional process complexity in view of the deposition and patterning of the interlayer dielectric materials. It is well known that transistor performance may significantly depend on the characteristics of the gate electrode structures in advanced field effect transistors, wherein, in particular, threshold voltages, leakage currents and the like may strongly depend on the overall configuration of gate electrode structures. For example, in any complex semiconductor devices, the well-established gate dielectric material silicon dioxide or silicon oxynitride is increasingly being replaced, at least partially, by so-called high-k dielectric materials, which are to be considered as dielectric materials having a dielectric constant of 10.0 or higher. For instance, hafnium oxide, zirconium oxide and the like are well-established high-k dielectric materials that may be used for gate insulation layers. Furthermore, in addition to providing a high-k dielectric material, metal-containing electrode materials may also be provided in the gate electrode structure, which, according to well-established approaches, may be accomplished in a very late manufacturing stage, i.e., after completing the basic transistor configuration and providing a first interlayer dielectric material, which may thus act as a mask material for removing a placeholder material, such as silicon. Thereafter, any appropriate metal material or materials may be filled into the gate electrode structure, possibly in combination with high-k dielectric materials, and thereafter any excess material may be removed, for instance, by performing a polishing process, thereby obtaining the metal gate electrode structures. Next, a further interlayer dielectric material may be formed, wherein, conventionally, the previously-provided interlayer dielectric material and the further interlayer dielectric material may be commonly patterned to form contact elements so as to connect to the drain and source areas of the advanced transistors. Consequently, by additionally providing the contact bars prior to forming the further interlayer dielectric material in the replacement gate approach, no additional processes for depositing the interlayer dielectric material may be required. In some illustrative embodiments, the process complexity may further be reduced by depositing at least a portion of the electrode material of the gate electrode structure and of the contact bars in a common deposition process, which may be accomplished by patterning the interlayer dielectric material prior to actually depositing the desired electrode metal, such as aluminum and the like.

As a consequence, upon providing contact bars, for instance, extending along the entire width direction of transistors or active regions with a reduced height level, which may be contacted by contact elements providing superior AC performance, an overall reduced contact resistivity may be obtained without unduly compromising the AC performance, as may be the case in conventional strategies using contact trenches extending through the entire interlayer dielectric material. Hence, performance of sophisticated semiconductor devices including per se sophisticated transistors, for instance comprising high-k metal gate electrode structures and the like, may be enhanced due to the superior contact structure, thereby also providing the possibility of further scaling device dimensions without compromising overall device performance.

FIG. 1a schematically illustrates a cross-sectional view of a semiconductor device 100 comprising a substrate 101 and a semiconductor layer 102 formed above the substrate 101. The substrate 101 and the semiconductor layer 102 may represent any appropriate device architecture, such as a bulk configuration, an SOI (semiconductor- or silicon-on-insulator) configuration and the like. That is, in a bulk configuration, the semiconductor layer 102 may represent a portion of a crystalline material of the substrate 101, while, in an SOI configuration, a buried insulating material (not shown) may be positioned between the substrate 101 and the semiconductor layer 102, thereby providing a vertical isolation of the semiconductor layer 102. It should be appreciated that the term semiconductor layer is to be understood as to describe the layer 102 at an initial stage, while, in any subsequent process stages, as for instance shown in FIG. 1a, the semiconductor layer 102 may also comprise non-semiconductor areas, such as isolation structures 102C, for instance in the form of shallow trench isolations and the like. The isolation structure 102C, for instance comprised of silicon dioxide, silicon nitride and the like, may laterally delineate any semiconductor regions in the layer 102, such as an active region 102A and the like, which is to be under-stood as a semiconductor region including at least one PN junction for forming one or more transistor elements in and above the region 102A. In the embodiment shown, transistors 150A, 150B may be formed in and above the active region 102A, at least partially, and may have any appropriate configuration in accordance with the device requirements. For example, the transistors 150A, 150B may represent transistors of the same or inverse conductivity type, which may share a portion of the active region 102A, while, in other cases, any other appropriate configuration may be applied, as will also be described later on in more detail. In the manufacturing stage shown, the transistors 150A, 150B may comprise gate electrode structures 160A, 160B, respectively, which may have a similar configuration, for instance with respect to critical dimensions, material composition and the like. For example, the gate electrode structures 160A, 160B may comprise a gate insulation layer 161 and an electrode material 162, as required for achieving the desired performance of the device 100. For instance, the gate electrode structures 160A, 160B may have a gate length 160L of 40 nm and less in sophisticated applications. Consequently, the transistors 150A, 150B and thus the gate electrode structures 160A, 160B may represent closely spaced circuit elements, wherein a lateral distance may be on the order of magnitude of 150 nm and less, for instance, in densely packed device regions. Similarly, a length dimension of the active region 102A may be of similar magnitude, while a width, i.e., in FIG. 1a, a direction perpendicular to the drawing plane of FIG. 1a, may be several 100 nm and more, depending on the current strength capability of the transistors 150A, 150B.

In some illustrative embodiments, the gate electrode structures 160A, 160B may represent sophisticated transistor components, wherein the gate insulation layer 161 may comprise a high-k dielectric material, thereby increasing the capacitive coupling of the electrode material 162 to the active region 102A, while at the same time ensuring a moderately low leakage current upon operation of the transistors 150A, 150B. Similarly, the electrode material 162 may comprise a metal species, such as aluminum and the like, possibly in combination with appropriate work function adjusting metal species, such as lanthanum, aluminum, tantalum, titanium and the like. Furthermore, spacer elements 163, 164 may be provided in accordance with overall device and process requirements and may comprise silicon nitride, silicon dioxide and the like, or any combination of appropriate materials. Furthermore, in the embodiment shown, a drain/source region 151 may be provided in the active region 102A and may have any appropriate dopant profile as required. Furthermore, the drain/source regions 151 may have incorporated therein a contact region or area 152, which may be provided in the form of a metal silicide, such as nickel silicide and the like.

Additionally, the semiconductor device 100 may comprise a first interlayer dielectric material 110, such as a silicon dioxide material and the like, while, in other cases, as will be described later on in more detail, the material 110 may comprise two or more different material layers, depending on the overall process and device requirements. In this respect, an interlayer dielectric material is to be understood as a dielectric material provided for enclosing and passivating circuit elements, such as the transistors 150A, 150B, and separating the transistor elements from a metallization system (not shown) which is to be formed in a later manufacturing stage and which may be connected to the semiconductor-based circuit elements via a contact structure to be formed in the interlayer dielectric material, i.e., in the material 110 and a further interlayer dielectric material to be provided in a later manufacturing stage, on the basis of appropriate contact elements, as is also previously discussed.

The semiconductor device 100 as illustrated in FIG. 1a may be formed on the basis of the following processes. After providing the isolation structures 102C within the semiconductor layer 102, thereby defining the lateral position and size of any active regions, such as the region 102A, the processing may be continued by incorporating any dopant species into the active region 102A, as required, followed by the deposition or formation of any materials required for patterning a gate electrode structure. To this end, any appropriate process strategy may be applied, for instance appropriate gate dielectric materials, such as silicon dioxide, silicon oxynitride, may be provided, possibly in combination with a high-k dielectric material, and thereafter appropriate electrode materials, such as metal-containing materials in the form of titanium nitride and the like, in combination with other materials, such as silicon, may be deposited. In other cases, a high-k dielectric material, if required, may be provided in a later manufacturing stage. Based on any further additional materials, such as hard mask materials and the like, the resulting layer stack may be patterned in accordance with device requirements using sophisticated lithography and etch techniques, thereby obtaining the gate electrode structures 160A, 160B with a gate length 160L, wherein, however, as previously discussed, one or more of the previously-provided materials may be replaced in a later manufacturing stage. Similarly, the sidewall spacers 163 and 164 may be formed in accordance with any appropriate process technique and the dopant profile of the region 151 may be established in accordance with well-established implantation techniques and the like. It should be appreciated that, if required, additional performance enhancing mechanisms may be implemented in the device 100, for instance by providing a strain-inducing semiconductor material in some of the active regions and the like. For convenience, any such mechanism is not illustrated in FIG. 1a. After any anneal processes, the metal silicide regions 152, if required, may be formed, for instance by well-established silicidation techniques, and thereafter the interlayer dielectric material 110 may be deposited, for instance in the form of silicon dioxide and the like, possibly in combination with additional etch stop materials (not shown), such as silicon nitride, high-k dielectric materials and the like. For this purpose, any well-established deposition technique may be applied. Next, the interlayer dielectric material 110 may be planarized, for instance by performing an etch process, a polishing process, such as chemical mechanical polishing (CMP) and the like.

In some illustrative embodiments, during the removal of any excess material of the interlayer dielectric material 110, a placeholder material (not shown), such as polysilicon and the like may be exposed and may be subsequently removed on the basis of highly selective etch chemistries, such as wet chemical etch chemistries, plasma based etch chemistries and the like, for which a plurality of process recipes are available. Depending on the overall process strategy, any appropriate conductive materials may be deposited so as to form the electrode material 162 in accordance with any appropriate replacement gate approach, wherein, if required, prior to depositing the conductive materials, a dielectric material may be deposited or formed in any other manner so as to form the gate insulation layer 161, which may then also be formed on sidewalls of the electrode material 162. After the deposition of one or more conductive materials, which may also comprise any work function adjusting metal species, such as aluminum, lanthanum, titanium, tantalum and the like, any excess material may be removed, for instance by CMP, thereby providing the gate electrode structures 160A, 160B as illustrated in FIG. 1a.

Figure 1B:
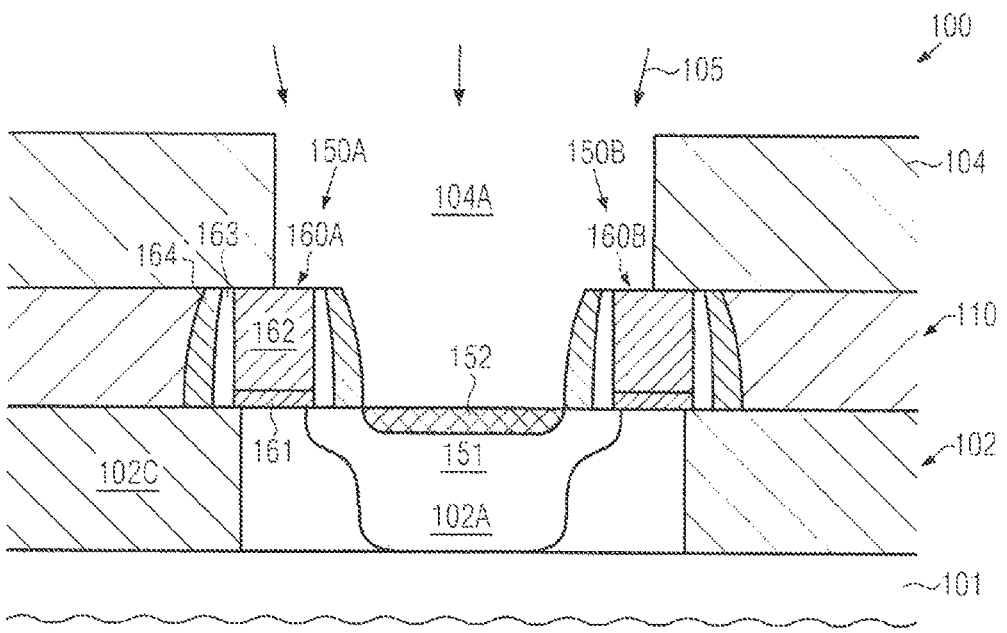

FIG. 1b schematically illustrates the semiconductor device 100 in a further advanced manufacturing stage. As illustrated, an etch mask 104, such as a resist mask, may be provided so as to expose at least the contact area 152 positioned in the active 102A between the gate electrode structures 160A, 160B. Thus, a corresponding opening 104A of the etch mask 104 may have a lateral dimension in the length direction, i.e., in FIG. 1b, the horizontal direction, which is at least a lateral distance between the gate electrode structures 160A, 160B. In the example shown, the opening 104A may also expose a portion of the gate electrode structures 160A, 160B, thereby reducing complexity of a corresponding lithography process, as long as the opening 104A is globally aligned to the contact area 152 and has a lateral dimension so as to reliably expose the area 152. Consequently, in this sense, the exposure of the contact area 152 may be referred to as self-aligned, since, upon performing an etch process 105 for removing material of the interlayer dielectric material 110, the etch stop capabilities of the gate electrode structures 160A, 160B may result in exposure of the contact area 152, without requiring a precise lateral definition by the etch mask 104. For example, during the etch process 105, wet chemical etch chemistries, such as hydrofluoric acid (HF), or plasma-assisted etch recipes may be applied, wherein any such etch recipes may have a pronounced etch selectivity with respect to the materials of the spacers 163, 164 and the electrode material 162.

Figure 1C:
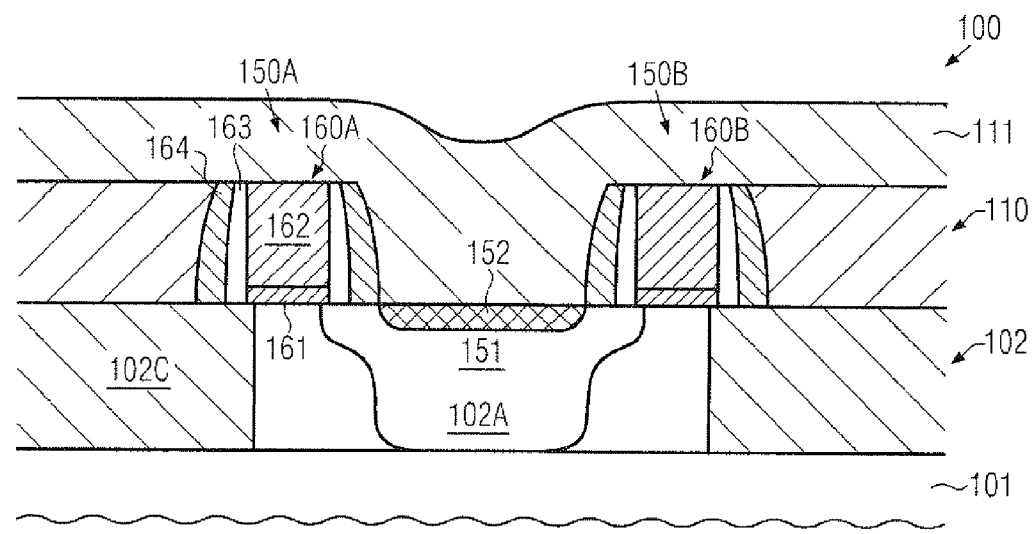

FIG. 1c schematically illustrates the semiconductor device 100 with a layer of conductive material 111 formed above the interlayer dielectric material 110, the gate electrode structures 160A, 160B and on the contact area 152, thereby substantially completely filling the space between the gate electrode structures 160A, 160B. The conductive material 111 may represent any appropriate material or materials, such as typical contact metals, in the form of tungsten, possibly in combination with additional barrier materials, such as titanium nitride, titanium and the like, while, in other cases, aluminum and the like may be provided. The semiconductor device 100 as illustrated in FIG. 1c may be formed in accordance with any appropriate deposition techniques, after removing the etch mask 104 (FIG. 1b). For example, a plurality of appropriate metal materials may be efficiently deposited on the basis of physical vapor deposition (PVD) techniques, while, in other cases, electrochemical deposition processes may be applied. It should be appreciated that, addition-ally, any seed layers, if required, may be formed, for instance by chemical vapor deposition (CVD), sputter deposition and the like. Moreover, due to the fact that, in some illustrative embodiments, the entire space between the gate electrode structures 160A, 160B may be filled by the material 111, significantly less critical deposition conditions may be encountered during the deposition process compared to the deposition of a contact metal in conventional contact structures. For instance, a corresponding opening defined by the lateral space between the gate electrode structures 160A, 160B may have a significantly smaller aspect ratio compared to any conventional contact elements, which may have to extend through the entire interlayer dielectric material.

Figure 1D:
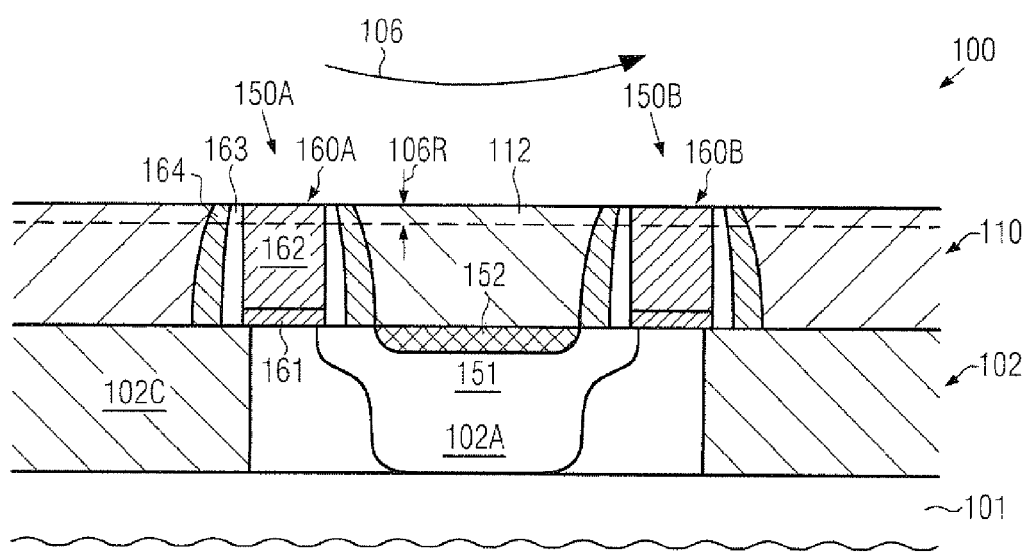

FIG. 1d schematically illustrates the semiconductor device 100 during a material removal process 106, in which an excess portion of the conductive material 111 (FIG. 1c) may be removed. To this end, any appropriate process or processes may be applied, such as CMP, etching, a combination thereof and the like. During the removal process 106, a final height of the gate electrode structures 160A, 160B may also be adjusted, for instance, by removing a portion of the interlayer dielectric material 110 and of the gate electrode structures (as indicated by 106R) so as to reliably electrically isolate a contact bar 112 formed in the space between the gate electrode structures 160A, 160B from the electrode material 162 of these gate electrode structures. Consequently, the contact bar 112 may connect to the contact area 152 and may be laterally delineated by the gate electrode structures 160A, 160B, i.e., the spacer elements 164, thereby providing a significantly reduced contact resistivity compared to conventional square-shaped or substantially round contact elements. On the other hand, the contact bar 112 may have a reduced height compared to conventional contact elements and may extend to a height level that substantially corresponds to the height level of the gate electrode structures 160A, 160B. Consequently, the parasitic capacitance of the contact bar 112 may not be unduly increased, while at the same time providing the superior contact resistivity. In other illustrative embodiments (not shown), the height level of the contact bar 112 may be selectively reduced, for instance by applying an etch process, which may have a pronounced etch selectivity with respect to the electrode material 162, which may be achieved by appropriately selecting the material 112 with respect to the electrode materials 162. Consequently, in this case, the parasitic capacitance between the contact bar 112 and the gate electrode structures 160A, 160B may further be reduced, while nevertheless providing a reduced contact resistance.

Figure 1E:
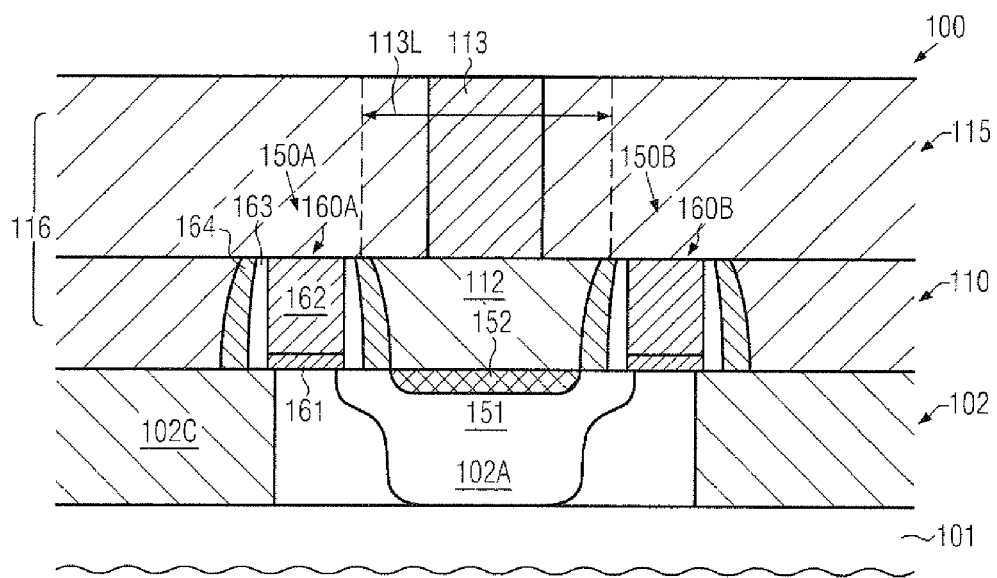

FIG. 1e schematically illustrates the semiconductor device 100 in a further advanced manufacturing stage. As is shown, a second interlayer dielectric material 115 may be formed above the first interlayer dielectric material 110 and thus above the gate electrode structures 160A, 160B and above the contact bar 112. It should be appreciated that, in the embodiment shown, the gate electrode structures 160A, 160B and the contact bar 112 may have substantially the same height level, while, in other cases, the contact bar 112 may extend to a reduced height level compared to the gate electrode structures 160A, 160B, so that, in this case, the second interlayer dielectric material 115 may act as an appropriate fill material for filling the space between the gate electrode structures 160A, 160B (not shown). The interlayer dielectric material 115 may have any appropriate composition and may, for instance, be provided with the same material composition as the material 110 or at least a portion thereof. For example, the material 115 may be provided in the form of a silicon dioxide material and the like. Consequently, the first and second interlayer dielectric materials 110, 115 may represent an interlayer dielectric material or any level of the device 100, which may thus represent an interface separating the circuit elements, such as the transistors 150A, 150B, from a metallization system (not shown) still to be formed above the interlayer dielectric materials 116. Moreover, a contact element 113 may be provided in the material 115 as to connect to the contact bar 112, wherein a lateral length dimension 113L of the contact element 113 may be selected in accordance with device requirements so as to obtain a moderately low overall resistance, while not unduly increasing the overall parasitic capacitance with respect to the gate electrode structures 160A, 160B. Thus, as indicated, by the dashed lines, any appropriate length 113L may be selected. On the other hand, the lateral dimension of the contact element 113 in the width direction, i.e., perpendicular to the drawing plane of FIG. 1e, may be significantly less compared to the extension of the contact bar 112, as will be described in more detail with reference to FIG. 1f. The contact element 113 may comprise any appropriate conductive material, such as tungsten, aluminum, copper and the like, possibly in combination with appropriate barrier materials, and the like. The interlayer dielectric material or materials 116 in combination with the contact element 113 and the contact bar 112 may represent a contact structure acting as an interface between a metallization system (not shown) and the transistors 150A, 150B. It should be appreciated that contact elements may also be provided in the material 115 so as to connect to one or both of the gate electrode structures 160A, 160B. For convenience, any such contact elements are not illustrated.

The material 115 may be formed on the basis of any appropriate deposition technique, wherein, depending on the height level of the contact bar 112, a more or less pronounced surface topography may be created, which may be planarized, if required, on the basis of CMP and the like. Thereafter, lithography processes may be applied for forming an etch mask and patterning the material 115, wherein process conditions are less critical compared to conventional strategies, since any openings in the material 115 may have to extend to a less critical height level compared to conventional techniques, even if the contact bar 112 may be provided so as to extend to a lower height level compared to the gate electrode structures 160A, 160B. Thereafter, the resulting contact opening may be filled with any appropriate material, wherein, also in this case, less critical deposition conditions may be encountered due to the less critical aspect ratio of the respective contact openings. Thereafter, any appropriate material removal process may be applied so as to remove any excess material, thereby forming the contact element 113.

Figure 1F:
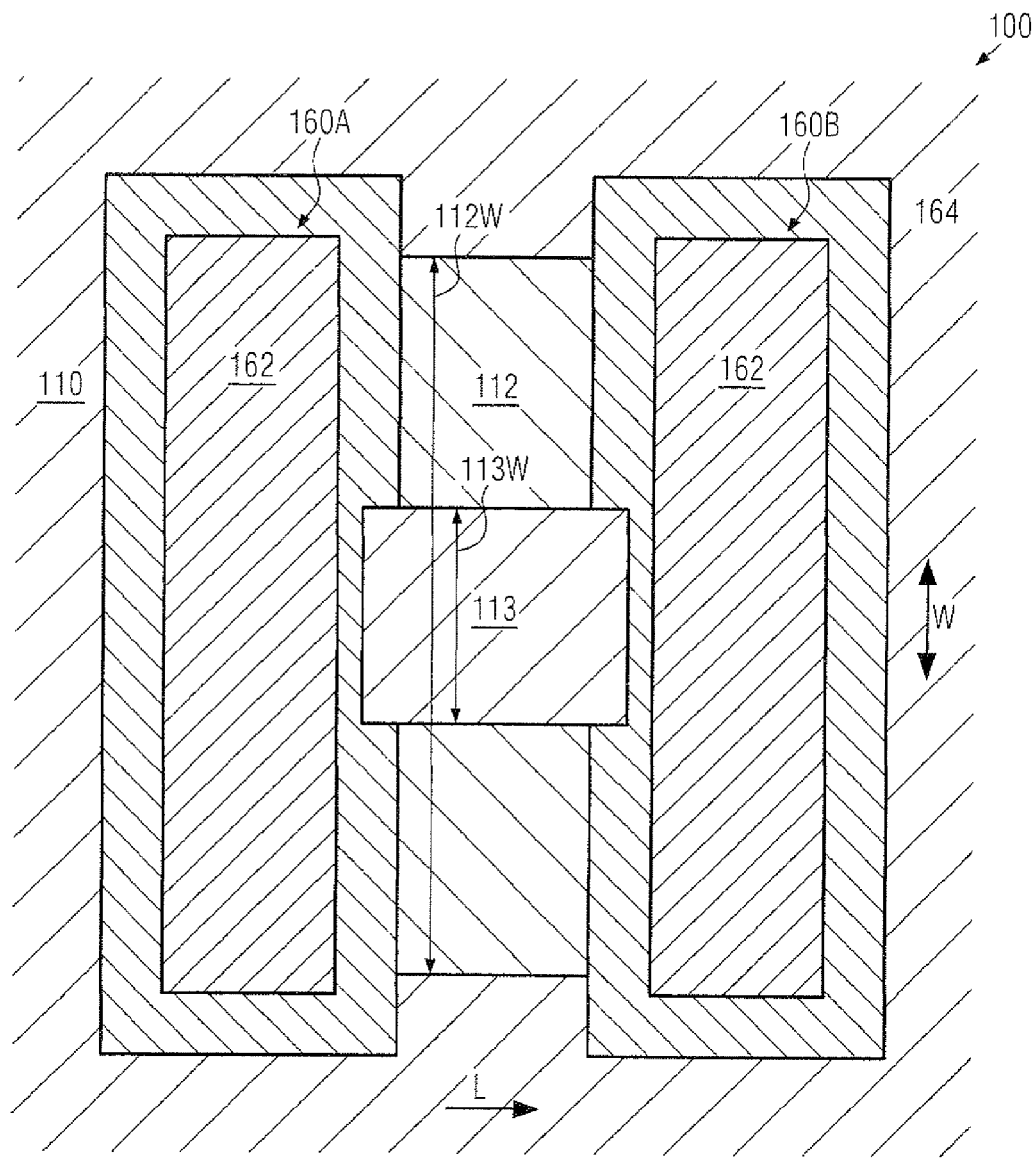
FIG. 1f schematically illustrates a top view of the semiconductor device, wherein the lateral extension of the contact bar along the transistor width direction is significantly greater than the lateral extension of a contact element connecting to the contact bar, according to illustrative embodiments.

FIG. 1f schematically illustrates a top view of the semiconductor device 100, wherein, for convenience, it may assumed that the second interlayer dielectric material 115 (FIG. 1e) is transparent. Thus, as illustrated, the contact bar 112 extends along a length direction, indicated as L, between the gate electrode structures 160A, 160B, i.e., the corresponding spacer elements 164. In a width direction, indicated as W, the contact bar 112 has a lateral extension 112W, which may, in the embodiment shown, extend along the entire length of the active region (FIG. 1a) if desired. Thus, a significantly reduced contact resistivity may be provided by the contact bar 112. On the other hand, the contact element 113 may have a configuration, as viewed from a top view, that may substantially correspond to a conventional design, that is, to a design that provides a reduced parasitic capacitance, wherein at least a lateral extension 113W along the width direction W is significantly less compared to the extension 112W. For example, the extension 113W is less than half of the lateral extension 112W.

With reference to FIGS. 2a-2f, further illustrative embodiments will now be described in more detail, in which reduced process complexity may be accomplished by providing at least a portion of an electrode material and a portion of the conductive material of the contact bar in a common deposition process.

Figure 2A:
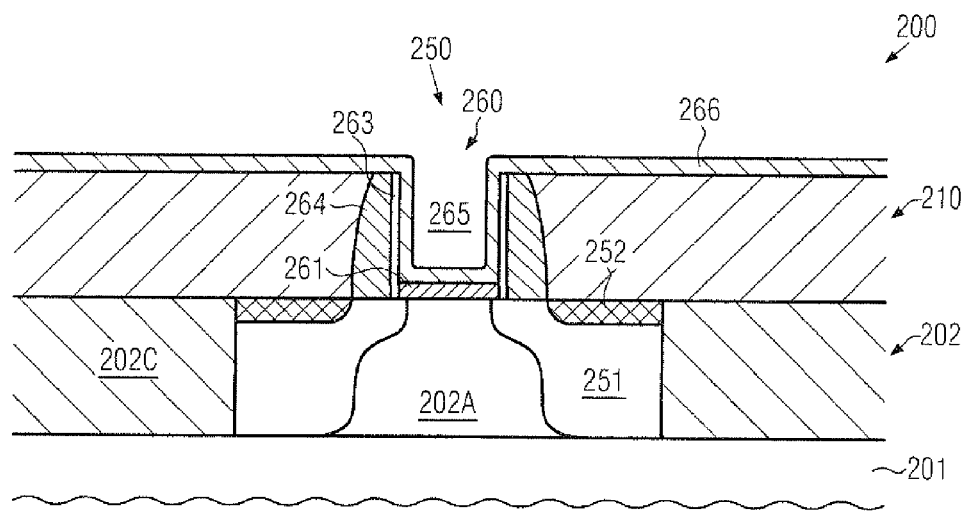
FIGS. 2a-2f schematically illustrate cross-sectional views of a semiconductor device during various manufacturing stages in forming a contact bar on the basis of a conductive material that may also be used for providing an electrode material in a gate electrode structure, according to illustrative embodiments.

FIG. 2a schematically illustrates a cross-sectional view of a semiconductor device 200 comprising a substrate 201 and a semiconductor layer 202. In the semiconductor layer 202, an active region 202A may be laterally delineated by an isolation structure 202C. Moreover, a transistor 250 may be formed in and above the active region 202A and may comprise a gate electrode structure 260. For example, a spacer 263 and a further spacer element 264 may be provided on the gate electrode structure 260 in order to define, for instance, the lateral profiling of drain and source regions 251 and a contact area 252, for instance provided in the form of a metal silicide region, such as nickel silicide and the like. It should be appreciated that, with respect to any characteristics of the components described so far, the same criteria may apply as previously explained with reference to the semiconductor device 100.

Furthermore, in the manufacturing stage shown, the gate electrode structure 260 may comprise a gate opening 265 and, in some illustrative embodiments, a gate insulation layer 261 formed at the bottom of the gate opening 265. Furthermore, the gate electrode structure 260 may be laterally embedded by an interlayer dielectric material 210, which may have any appropriate configuration as is also discussed above.

The semiconductor device 200 as illustrated in FIG. 2a may be formed on the basis of any appropriate process technique, such as a process strategy as previously described above with reference to the semiconductor device 100, in order to form the basic configuration of the transistor 250 and provide the first interlayer dielectric material 210. Thereafter, upon exposing any placeholder material, such as a polysilicon material, of the gate electrode structure 260, this material may be removed, as also discussed above, and any appropriate material or material layers 266 may be formed in the gate opening 265. For example, the material system 266 may comprise a high-k dielectric material, if not provided in the gate insulation layer 261, while, in other cases, the gate insulation layer 261 may be provided in its desired final configuration and the material system 266 may have incorporated therein any appropriate metal species for adjusting a work function of the gate electrode structure 260. It should be appreciated that the material system 266 may have a different configuration for transistors of different conductivity types.

Figure 2B:
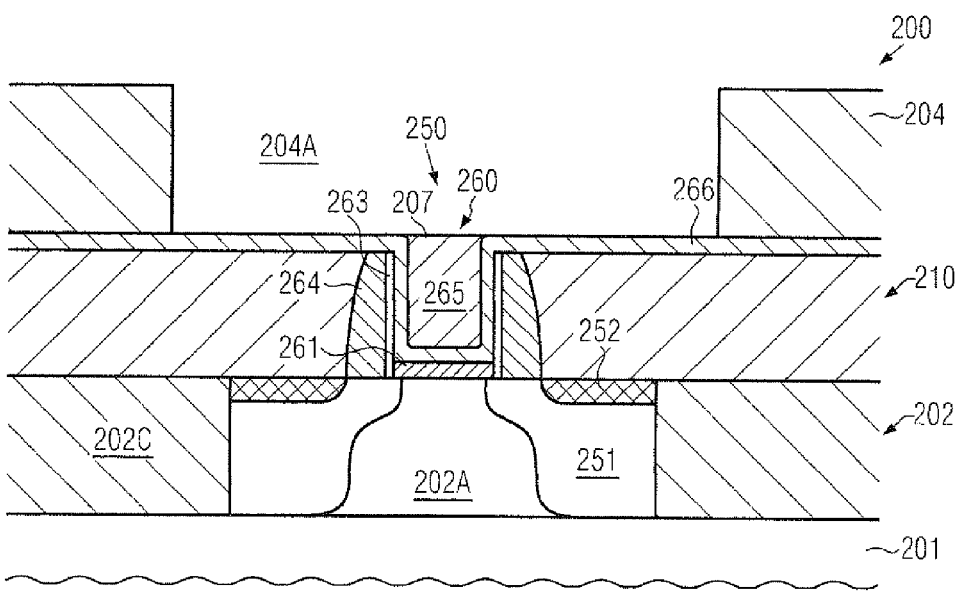

FIG. 2b schematically illustrates the semiconductor device 200 in a further advanced manufacturing stage. As illustrated, a sacrificial fill material 207, such as an organic planarization material and the like, may be provided in the opening 265 and an etch mask 204, such as a resist mask, may be formed above the layer 266 and may have an opening 204A so as to define the lateral size and position of contact bars to be formed in the interlayer dielectric material 210 so as to connect to the contact areas 252 formed in the drain and source regions 251.

The sacrificial fill material 207 may be provided on the basis of well-established spin-on techniques using appropriate organic materials, which are available in the form of optical planarization materials. Thereafter, the mask 204 may be formed on the basis of well-established lithography techniques, wherein any excess material of the sacrificial material 207 may also be patterned, however, at least remaining a portion within the gate opening 265. Next, an appropriate etch chemistry may be applied so as to first remove exposed portions of the material system 266, while using the sacrificial material 207 as an etch stop material for preserving at least a significant portion of the material system 266 within the gate opening 265. Next, an exposed portion of the interlayer dielectric material 210 may be removed, for instance, by wet chemical etch processes, plasma assisted etch processes and the like. Hence, the contact areas 252 may be exposed. Thereafter, the etch mask 204 and the sacrificial fill material 207 may be removed, for instance, by using oxygen plasma recipes, wet chemical etch recipes and the like.

Figure 2C:
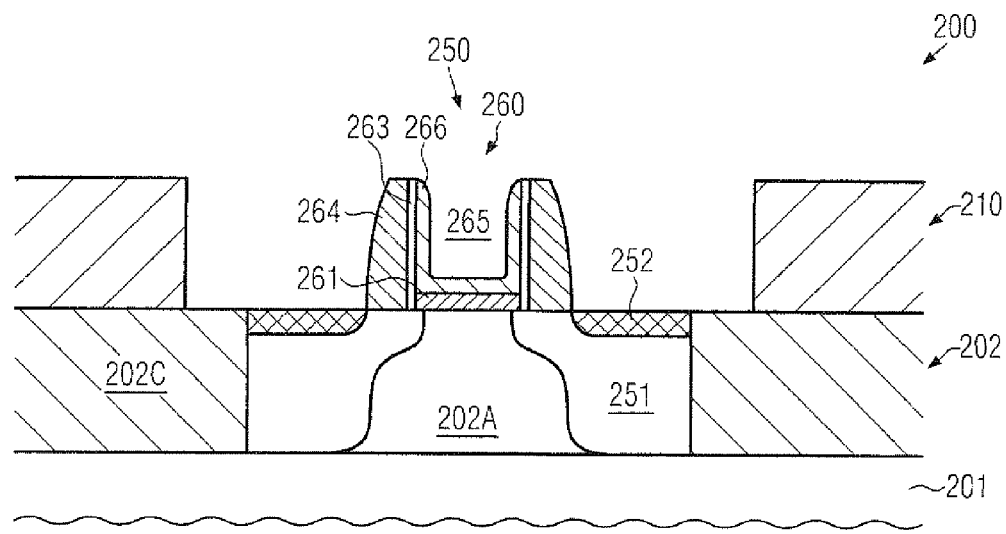

FIG. 2c schematically illustrates the semiconductor device 200 with the gate electrode structure 260, wherein the material layer 266 may still be provided at least at the bottom of the gate opening 265, thereby reliably adjusting the desired electronic characteristics of the gate electrode structure 260. Furthermore, the contact areas 252 are exposed in order to receive a contact material for connecting to the drain and source regions with reduced contact resistivity.

Figure 2D:
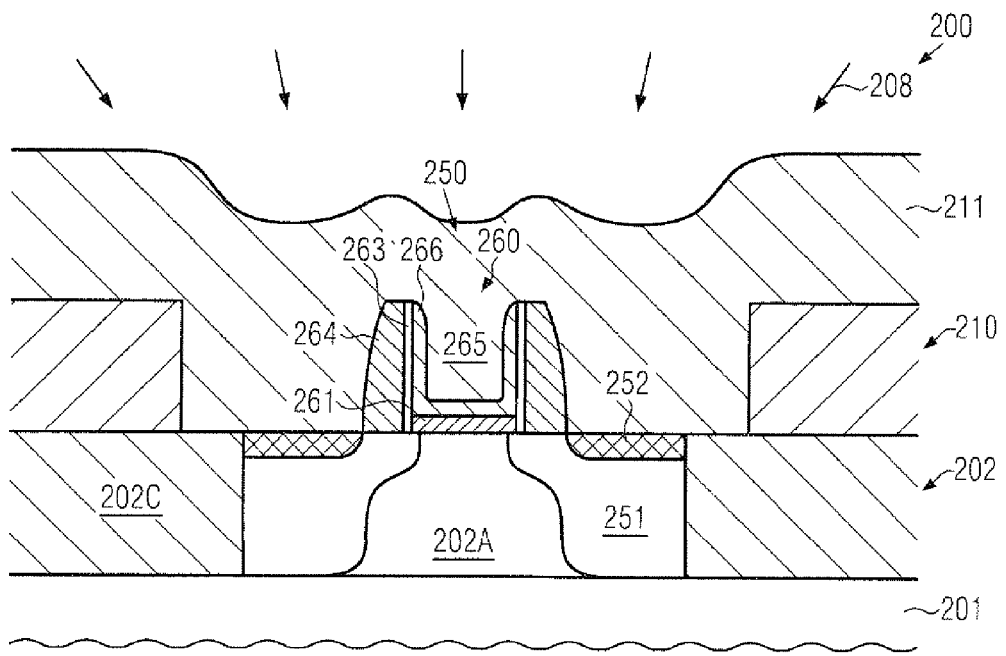

FIG. 2d schematically illustrates the semiconductor device 200 during a deposition process 208 in order to form a layer of conductive material 211 on the contact area 252 and within the gate opening 265. The conductive material 211 may represent any appropriate material, such as aluminum, tungsten, copper and the like, possibly in combination with an additional barrier material, if required, in order to provide superior conductivity of the gate electrode structure 260 and of contact bars connecting to the drain and source regions 251. The material 211 may be deposited on the basis of any appropriate deposition technique, such as PVD, CVD, electrochemical deposition or any combination thereof.

Figure 2E:
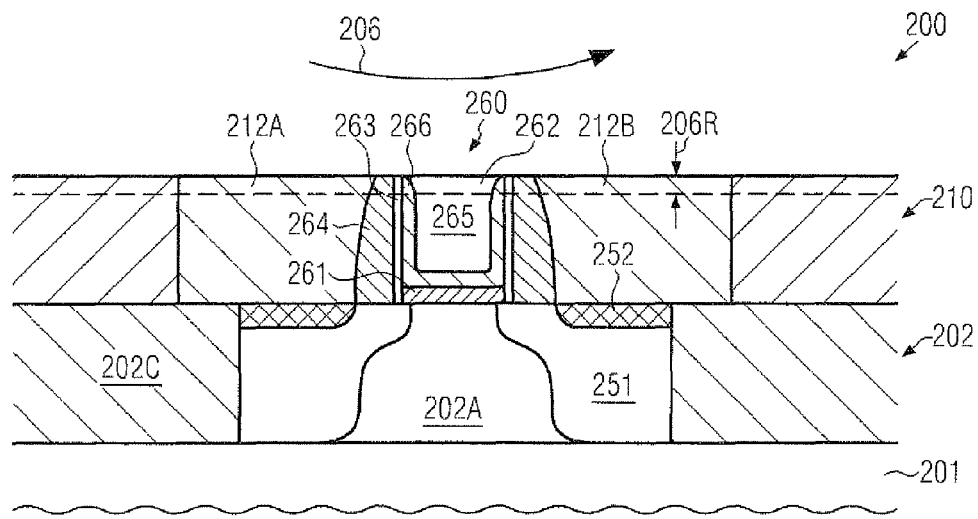

FIG. 2e schematically illustrates the semiconductor device 200 during a material removal process 206, such as a CMP process and the like, in which an excess portion of the material 211 (FIG. 2d) may be removed, thereby forming electrically isolated contact bars 212A, 212B connecting to the drain and source regions 251. At the same time, an electrode material 262 is formed in the gate electrode structure 260 and is electrically isolated from the contact bars 212A, 212B. For this purpose, the removal process 206 may be performed on the basis of an appropriate over-polish time so as to reliably remove any metal residues, wherein a final height level of the gate electrode structure 260 may also be adjusted, as indicated by 206R. Consequently, during the removal process 206, the interlayer dielectric material 210 and the spacer elements 264 and 263 may act as efficient stop materials.

Figure 2F:
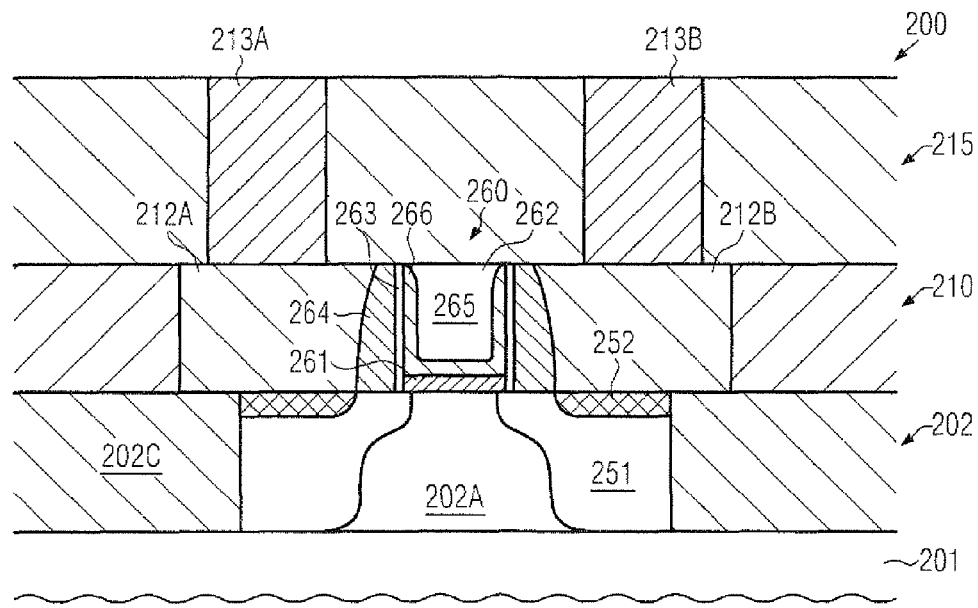

FIG. 2f schematically illustrates the semiconductor device 200 in a further advanced manufacturing stage. As illustrated, a second interlayer dielectric material 215 may be formed above the material 210 and above contact bars 212A, 212B and the gate electrode structure 260. A first contact element 213A is provided in the interlayer dielectric material 215 so as to connect to the contact bar 212A, whereas a second contact element 213B may connect to the contact bar 212B. With respect to the lateral dimensions of the contact elements 213A, 213B, it should be appreciated that these contact elements may have any appropriate lateral dimensions so as to not unduly increase the total parasitic capacitance with respect to the gate electrode structure 260. For example, as also previously discussed, the contact elements 213A, 213B may have a lateral extension along a width direction, i.e., along a direction perpendicular to the drawing plane of FIG. 2f, that is less compared to a lateral extension of the contact bars 212A, 212B along the width direction. The dielectric material 215 and the contact elements 213A, 213B may be formed in accordance with any appropriate process technique, as is, for instance, also previously discussed above with reference to the semiconductor device 100.

Figure 2G:
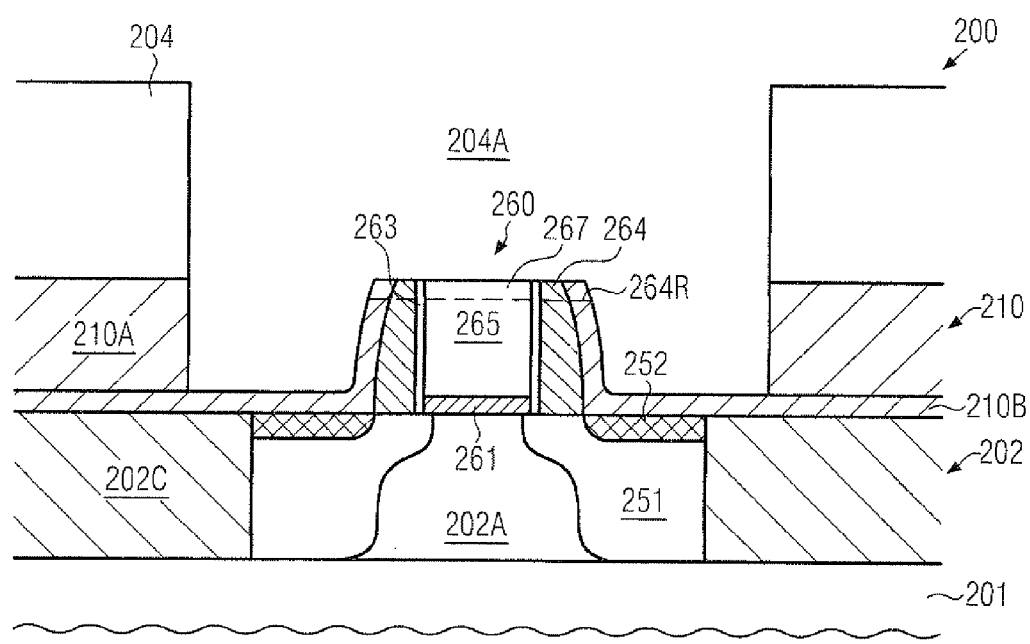
FIG. 2g schematically illustrates a cross-sectional view of the semiconductor device according to further illustrative embodiments, wherein a contact etch stop layer may be provided in a first interlayer dielectric material, which may be selectively opened in order to expose contact areas for forming contact bars.

FIG. 2g schematically illustrates the semiconductor device 200 according to further illustrative embodiments. As illustrated, the etch mask 204 comprising the mask opening 204A for defining the lateral size of corresponding contact bars may be formed on the inter-layer dielectric material 210, which may comprise an etch stop material 210B, such as a silicon nitride material, and a second material layer 210A, for instance in the form of a silicon dioxide material. Furthermore, an exposed portion of the layer 210A within the opening 204A may have been removed, for instance by a selective plasma assisted etch recipe, by wet chemical etch processes and the like, as previously described. Furthermore, in the embodiment shown, the gate electrode structure 260 may still comprise a placeholder material 267, such as a polysilicon material and the like. In some illustrative embodiments, the further processing may be continued by removing the material layer 210B at least above a portion of the contact areas 252 within the opening 204A, for instance prior to removing the placeholder material 267, which may be accomplished by applying plasma-assisted etch recipes, using the material 252 as an efficient etch stop material. In this case, a material erosion in the regions 252 may be less critical, since a highly conductive material may be provided in a later manufacturing stage, thereby preserving a desired low contact resistance. Furthermore, by using a plasma-assisted etch process, a portion of the spacer elements 264 and 263 may also be removed, thereby obtaining a height level, as indicated by 264R. Thereafter, the placeholder material 267 may be removed, for instance, by a wet chemical etch recipe, using the exposed contact areas 252 and the remaining spacer elements 264 and 263 as etch stop materials. Thereafter, the further processing may be continued by removing the mask 204 and depositing an appropriate material so as to fill the resulting gate opening and to provide the contact metal for contact bars connecting to the contact areas 252, as is also discussed above. It should be appreciated that the deposition of the conductive material may also include the deposition of a work function adjusting metal species, if required. In other illustrative embodiments, the contact areas 252 may be provided as a highly doped semiconductor material, thereby not requiring any additional metal silicide processes, wherein an appropriate contact resistivity may be obtained on the basis of a conductive material to be provided in the gate electrode structure 260. In this case, upon removing a portion of the material 210B within the opening 204A, plasma assisted etch recipes for etching silicon nitride material may be applied, which may exhibit a self-limiting etch behavior, thereby forming silicon oxide material within the drain and source regions 251, which may then efficiently act as an etch stop material upon removing the placeholder material 267, for instance on the basis of TMAH (tetra methyl ammonium hydroxide) and the like.

As a result, the present disclosure provides manufacturing techniques and semiconductor devices in which a contact structure may be formed on the basis of contact bars of reduced height in combination with "conventional" contact elements, thereby providing a reduced contact resistance while at the same time avoiding undue increase of the fringing capacitance of the contact structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a metal-containing electrode material layer so as to line sidewall and bottom surfaces of a gate opening formed in a gate electrode structure of a transistor of a semiconductor device;
    after forming said metal-containing electrode material layer, forming a contact opening so as to expose a contact area of at least one of a drain region and a source region of said transistor and a sidewall surface of a sidewall spacer positioned adjacent to said gate electrode structure, wherein forming said contact opening comprises selectively removing a portion of a first interlayer dielectric material with respect to at least said sidewall surface of said sidewall spacer, said contact opening being self-aligned with respect to at least said sidewall surface of said sidewall spacer;
    completely filling said contact opening and said gate opening with a contact metal during a same material deposition step, wherein said contact metal completely filling said contact opening and said gate opening is deposited on and in direct contact with said exposed contact area and said exposed sidewall surface of said sidewall spacer;
    removing excess material of said conductive material so as to form at least one contact bar, wherein said contact bar is self-aligned with respect to said sidewall spacer element; and
    forming a second interlayer dielectric material above said first interlayer dielectric material and said contact bar.

2. The method of claim 1, further comprising, prior to forming said contact opening, forming a sacrificial fill material in said gate opening so that an upper exposed surface of said sacrificial fill material is substantially aligned with an upper exposed surface of a portion of said metal-containing electrode material layer formed outside of said gate opening and above said first interlayer dielectric material, wherein said contact opening is formed in the presence of at least a portion of said sacrificial fill material.

3. The method of claim 2, further comprising, after forming said sacrificial fill material in said gate opening, forming a patterned mask layer above said first interlayer dielectric material and using said patterned mask layer as an etch mask for forming said contact opening.

4. A method, comprising:
    forming a metal-containing electrode material layer so as to line sidewall and bottom surfaces of a gate opening formed in a gate electrode structure of a transistor of a semiconductor device;
    after forming said metal-containing electrode material layer, forming a sacrificial fill material in said gate opening;
    after forming said sacrificial fill material, forming a patterned etch mask above a first interlayer dielectric material laterally surrounding said gate electrode structure, wherein a height level of an exposed upper surface of said patterned etch mask relative an active region of said transistor is above a height level of an exposed upper surface of said sacrificial fill material relative to said active region;
    forming a contact opening through said first interlayer dielectric material by performing an etch sequence through said patterned etch mask in the presence of said sacrificial fill material, said contact opening exposing a contact area of at least one of a drain region and a source region of said transistor and a sidewall surface of a sidewall spacer element formed adjacent to said gate electrode structure, said etch sequence removing a portion of a first interlayer dielectric material selectively with respect to at least a portion of said gate electrode structure and said sidewall spacer element;
    removing said sacrificial fill material from said gate opening;
    completely filling said gate opening and said contact opening with a conductive material during a same material deposition process, wherein completely filling said contact opening comprises depositing said conductive material on and in direct contact with said exposed sidewall surface of said sidewall spacer element;
    removing excess material of said conductive material so as to form at least one contact bar, wherein said contact bar is self-aligned with respect to said sidewall spacer element; and
    forming a second interlayer dielectric material above said first interlayer dielectric material and said contact bar.

5. The method of claim 4, wherein said metal-containing electrode material comprises a work function adjusting material.

6. The method of claim 4, further comprising forming a contact element in said second interlayer dielectric material so as to connect to said contact bar.

7. The method of claim 6, wherein said contact element is formed so as to have a lateral extension along a width direction of said transistor that is less than a lateral extension of said contact bar.

8. The method of claim 4, wherein removing said excess material comprises performing a polishing process.

9. The method of claim 8, wherein performing said polishing process comprises adjusting a final height of a gate electrode structure of said transistor.

10. A method of forming a contact structure in a semiconductor device, the method comprising:
    forming a metal-containing electrode material layer so as to line sidewall and bottom surfaces of a gate opening formed in a gate electrode structure of a transistor comprising said semiconductor device;

forming a sacrificial fill material above said metal-containing electrode material layer lining said gate opening, wherein an exposed upper surface of said sacrificial fill material is substantially aligned with an exposed upper surface of a portion of said metal-containing electrode material layer that is formed outside of said gate opening and above a first interlayer dielectric material laterally surrounding said gate electrode structure;

after forming said metal-containing electrode material and said sacrificial fill material in said gate opening, exposing a contact area of at least one of a drain region and a source region of said transistor in the presence of said sacrificial fill material by removing a portion of said first interlayer dielectric material selectively with respect to at least a portion of said gate electrode structure;

forming a contact bar in said first interlayer dielectric material, said contact bar connecting to at least one of said drain region and said source region of said transistor and having a first lateral extension along a transistor width direction;

forming a second interlayer dielectric material above said transistor and said contact bar; and forming a contact element in said second interlayer dielectric material so as to connect to said contact bar, said contact element having a second lateral extension along said transistor width direction that is less than said first lateral extension.

11. The method of claim 10, wherein said contact bar is self-aligned with respect to a sidewall spacer structure that is formed adjacent to said gate electrode structure.

12. The method of claim 10, wherein said contact bar has a third lateral extension along a transistor length direction and said contact element has a fourth lateral extension along said transistor length direction that is greater than said third lateral extension.

13. The method of claim 10, wherein exposing said contact area comprises forming a contact opening through said first interlayer dielectric, said contact opening exposing a sidewall surface of a sidewall spacer formed adjacent to said gate electrode structure, said contact opening being self-aligned with respect to at least said sidewall surface of said sidewall spacer.

14. The method of claim 13, wherein forming said contact bar comprises completely filling said contact opening and said gate opening with a contact metal during a same material deposition step, wherein said contact metal completely filling said contact opening and said gate opening is deposited on and in direct contact with at least said metal-containing electrode material layer and said exposed sidewall surface of said sidewall spacer.

15. The method of claim 10, wherein forming said contact bar comprises depositing said first interlayer dielectric material and planarizing said first interlayer dielectric material and removing said portion of said first interlayer dielectric material from above said at least one of said drain region and said source region prior to forming said sacrificial fill material and said metal-containing electrode material layer.

16. The method of claim 15, wherein removing said portion of said first interlayer dielectric material comprises forming an etch mask so as to define said first lateral extension of said contact bar and etching said first interlayer dielectric material selectively with respect to said etch mask and said gate electrode structure.

17. The method of claim 15, wherein forming said contact bar further comprises depositing a contact metal and removing excess material of said contact metal from above said at least one of said drain region and said source region and from above said gate electrode structure prior to forming said second interlayer dielectric material.

18. The method of claim 10, further comprising forming said gate electrode structure by providing a placeholder material and replacing at least a portion of said placeholder material with an electrode metal.

19. The method of claim 18, wherein said contact metal and said electrode metal represent the same type of metal material.

20. The method of claim 19, wherein forming said contact bar and replacing said at least said portion of said placeholder material comprises performing at least one deposition process so as commonly provide said contact metal and said electrode metal.

* * * * *